United States Patent
Hecht et al.

(10) Patent No.: US 10,523,208 B2
(45) Date of Patent: Dec. 31, 2019

(54) EFFICIENT LOOKUP TABLE MODULES FOR USER-PROGRAMMABLE INTEGRATED CIRCUITS

(71) Applicant: Microsemi SoC Corp., San Jose, CA (US)

(72) Inventors: Volker Hecht, Barsinghausen (DE); Jonathan W. Greene, Palo Alto, CA (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 16/177,340

(22) Filed: Oct. 31, 2018

(65) Prior Publication Data

US 2019/0165788 A1    May 30, 2019

Related U.S. Application Data

(60) Provisional application No. 62/590,913, filed on Nov. 27, 2017.

(51) Int. Cl.
*H03K 19/177* (2006.01)

(52) U.S. Cl.
CPC . *H03K 19/17728* (2013.01); *H03K 19/17736* (2013.01); *H03K 19/17748* (2013.01)

(58) Field of Classification Search
CPC ....... H03K 19/17728; H03K 19/17736; H03K 19/17748
See application file for complete search history.

(56) References Cited

U.S. PATENT DOCUMENTS

| | | | | |
|---|---|---|---|---|
| 5,274,581 A * | 12/1993 | Cliff | ...................... | G06F 1/0356 708/672 |
| 6,961,741 B2 * | 11/2005 | Swami | .................. | G06F 1/0356 708/235 |
| 7,030,650 B1 * | 4/2006 | Kaptanoglu | ..... | H03K 19/17728 326/39 |
| 7,336,097 B2 * | 2/2008 | Madurawe | ......... | H03K 19/1737 326/38 |
| 7,656,190 B2 * | 2/2010 | Dorairaj | ............... | G11C 7/1006 326/38 |
| 7,772,879 B1 * | 8/2010 | Feng | .................. | H03K 19/1737 326/38 |

* cited by examiner

*Primary Examiner* — Alexander H Taningco
*Assistant Examiner* — Kurtis R Bahr
(74) *Attorney, Agent, or Firm* — Glass and Associates; Kenneth D'Alessandro; Kenneth Glass

(57) ABSTRACT

A 4-input lookup table module including eight first-rank 2-input multiplexers, four second-rank multiplexers, two third-rank multiplexers, and one fourth-rank multiplexer, the first-rank through fourth-rank multiplexers forming a tree structure. A select input of the fourth-rank multiplexer is coupled to a first input node. Select inputs of the third-rank multiplexers are coupled to a second input node. Select inputs of a first and a second adjacent ones of the second rank 2-input multiplexers are electrically isolated from select inputs of a third and a fourth adjacent ones of the second rank 2-input multiplexers. Select inputs of a first through a fourth adjacent ones of the first rank 2-input multiplexers are electrically isolated from select inputs of a fifth through an eighth adjacent ones of the first rank 2-input multiplexers.

8 Claims, 10 Drawing Sheets

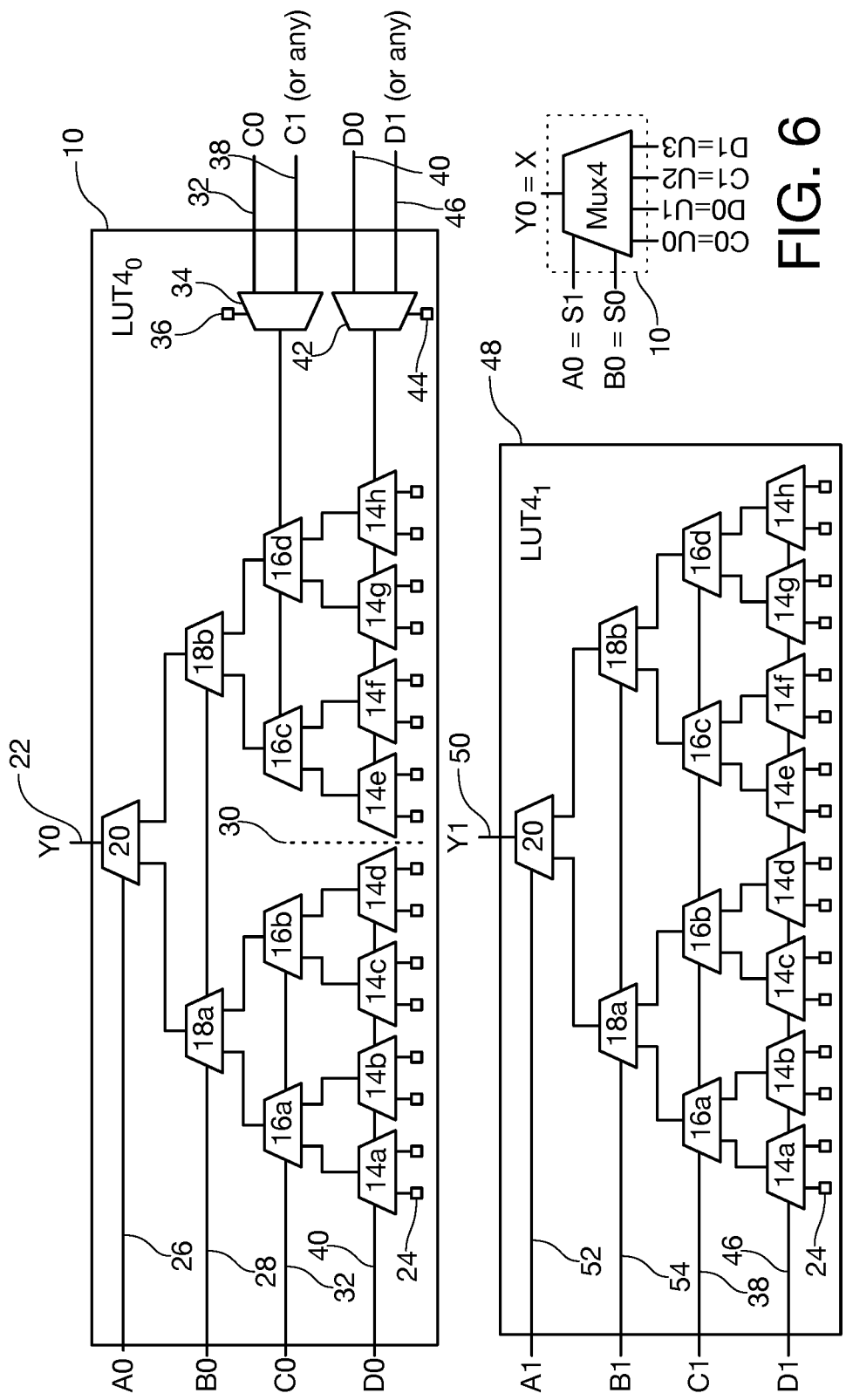

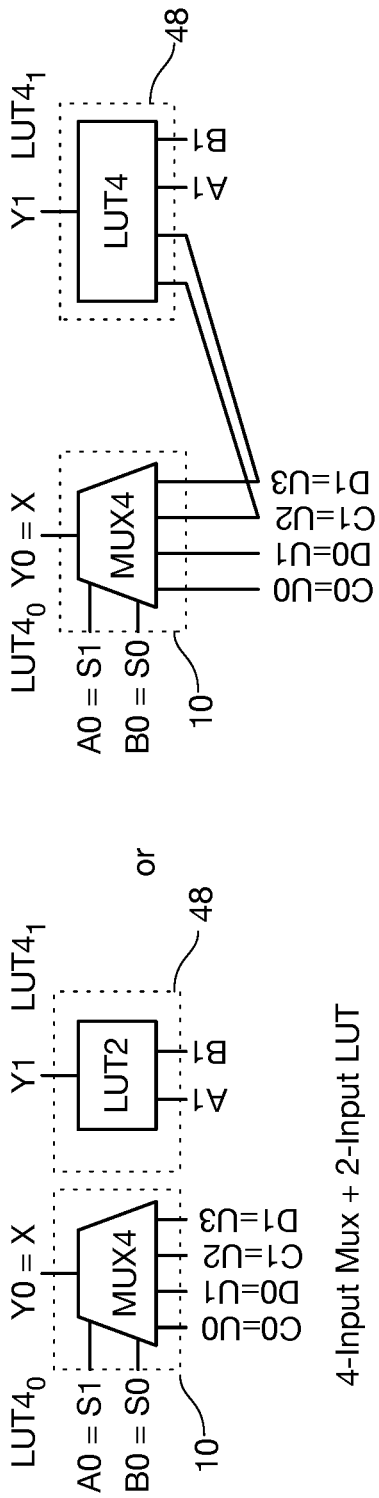
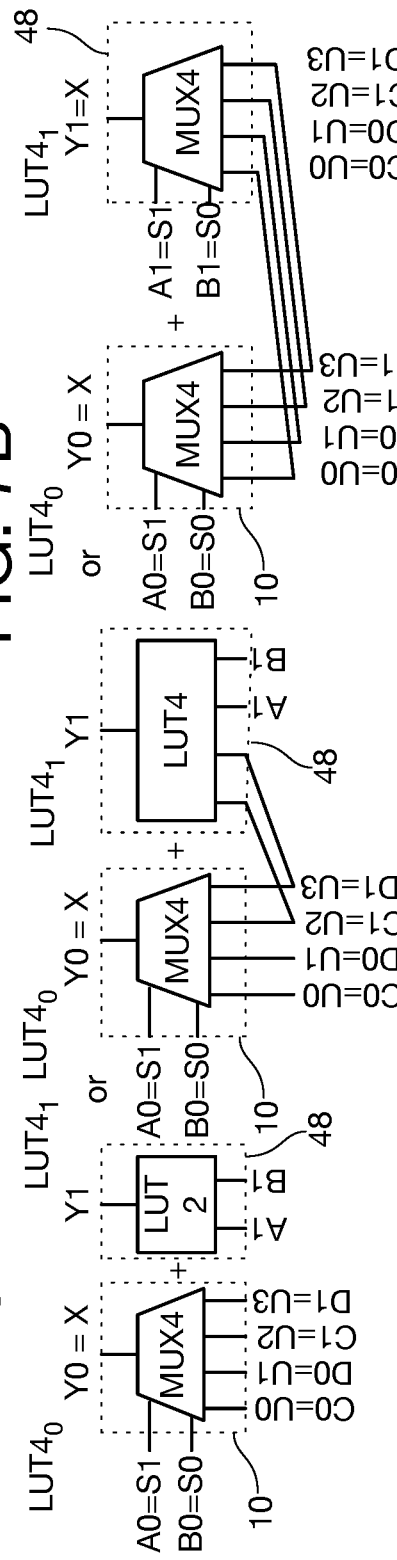

or

EFFICIENT LOOKUP TABLE MODULES FOR USER-PROGRAMMABLE INTEGRATED CIRCUITS

BACKGROUND

The present invention relates to integrated circuit technology. More particularly, the present invention relates to user programmable integrated circuits and to lookup table MODULESs (LUTs) used to configure circuit elements in user programmable integrated circuits.

LUTs are widely employed in user programmable integrated circuits A four-input LUT (LUT4) module is employed in user programmable field programmable gate array (FPGA) products, such as the ones designed and marketed by Microsemi SoC Corp., assignee of the present invention. A typical LUT4 module is shown in FIG. 1 and consists of four ranks of multiplexers configured in a tree structure. A first rank of eight 2-input multiplexers have their data inputs coupled to programmable constants, which determine the combinatorial logic of the LUT4. The first-rank multiplexers each have their select inputs coupled to a "D" input of the LUT4 module. A second rank of four 2-input multiplexers have their data inputs coupled to the outputs of an adjacent pair of the multiplexers of the first rank. The second rank multiplexers each have their select inputs coupled to a "C" input of the LUT4 module. The routing architecture for LUT4 circuits is well understood. A third rank of two 2-input multiplexers have their data inputs coupled to the outputs of an adjacent pair of the multiplexers of the second rank. The third rank multiplexers each have their select inputs coupled to a "B" input of the LUT4 module. A fourth rank of a single 2-input multiplexer has its data inputs coupled to the outputs of an adjacent pair of the multiplexers of the third rank. The fourth rank multiplexer has its select input coupled to an "A" input of the LUT4 module. The output of the fourth rank multiplexer is the output Y of the LUT4 module. The routing architecture for LUT4 module circuits is well understood.

Two LUT4 modules are required to configure a 4-input multiplexer (MUX4) circuit, as illustrated in FIG. 2. In the left portion of FIG. 2 a, combinatorial arrangement of a first $LUT4_0$ implements a first portion of the 4-input multiplexer is shown. Each of inputs A-D are denoted with a postscript "0" for clarity. A second combinatorial arrangement, representing a second portion of the 4-input multiplexer, implemented by a second $LUT4_1$, is shown adjacent the first $LUT4_0$, with each of the inputs A-D of the second $LUT4_1$, denoted with a postscript "1" for clarity. By connecting the output of LUT4 0, i.e, Y0, as the A1 input of LUT4 1, a 4-input multiplexer is formed as shown in the right two illustrations. For clarity, the select inputs of the 4-input multiplexer are denoted S0 and S1. It can be seen that select input S0 is formed by input A0, and select input S1 is formed by B0, B1, i.e. inputs B0 and B1 are tied together. In accordance with the naming convention used herein, the data inputs of the user-configured 4-input multiplexer are denoted U0, U1, U2 and U3 and their equivalents in the initial LUT4 implementations are shown (i.e. U0 is formed by C0; U1 is formed by C1; U2 is formed by C1 and U3 is formed by D1. This arrangement is relatively inefficient. The output of the user-implemented 4-input multiplexer is designated by X.

Six-input LUT modules (LUT6) are used in some FPGA integrated circuits. The use of LUT6 modules allows a MUX4 to be configured in one LUT6. A typical LUT6 module is shown in FIG. 3. A first LUT4 ($LUT4_0$) module is shown within dashed lines in FIG. 3. The outputs of $LUT4_0$ as well as from three additional LUT4 modules ($LUT4_1$, $LUT4_2$, and $LUT4_3$) are shown combined in a fifth rank of multiplexers, each having their select inputs coupled to the "B" input. The output Y of the LUT6 module is taken from the sixth rank multiplexer having the "A" input coupled to its select input. An equivalent circuit of the user-implemented 4-input multiplexer of the LUT6 module is shown in FIG. 4, with the data inputs of the 4-input multiplexer, denoted U0, U1, U2 and U3, the select inputs S1 and S0, with their equivalent inputs in the LUT6 identified, and the output identified as X, and is formed by output Y1.

A major drawback of a LUT6 module is that it occupies more than three times the area of a LUT4 module. In addition, a LUT6 module requires the use of four times as many configuration memory cells as a LUT4 module, and can be up to 40% slower than a LUT 4 module. A LUT6 module utilizes more than 50% more routing area than a LUT4 module.

Other disadvantages of a LUT6 module include an overall module-cost of about 1.75 times that of a LUT4-module, and an average LUT6 module count requirement of about 1.6 times that of a LUT4 module. Because of these and other disadvantages, it is desired to find an alternative to the use of a LUT6 module that will be efficient for configuring MUX4 circuits without the high area and performance penalties of LUT6 modules.

BRIEF DESCRIPTION

According to a first aspect of the present invention, a four-input multiplexer may be configured from a 4-input lookup table module including eight first-rank 2-input multiplexers, four second-rank multiplexers, two third-rank multiplexers, and one fourth-rank multiplexer, the first-rank through fourth-rank multiplexers form a tree structure. A select input of the fourth rank multiplexer is coupled respectively to an input signal at a first input node. Select inputs of all of the third rank multiplexers are coupled respectively to an input signal at a second input node. Select inputs of a first and second adjacent ones of the second rank 2-input multiplexers are coupled respectively to an input signal at a third input node. Select inputs of a third and fourth adjacent ones of the second rank 2-input multiplexers are coupled to the output of a first select multiplexer. Select inputs of a first through a fourth adjacent ones of the first rank 2-input multiplexers are coupled respectively to an input signal at a fourth input node. Select inputs of a fifth through an eighth adjacent ones of the first rank 2-input multiplexers are coupled to the output of a second select multiplexer. The first select multiplexer selects between the input signal at the third input node and an input signal at a fifth input node. The second select multiplexer selects between the input signal at the fourth input node and an input signal at a sixth input node. Data inputs of the first rank 2-input multiplexers are separately coupled to configuration bits. Select inputs of the first and second select multiplexers are separately coupled to configuration bits.

BRIEF DESCRIPTION OF THE DRAWING FIGURES

The invention will be explained in more detail in the following with reference to embodiments and to the drawing in which are shown:

Figure 3:
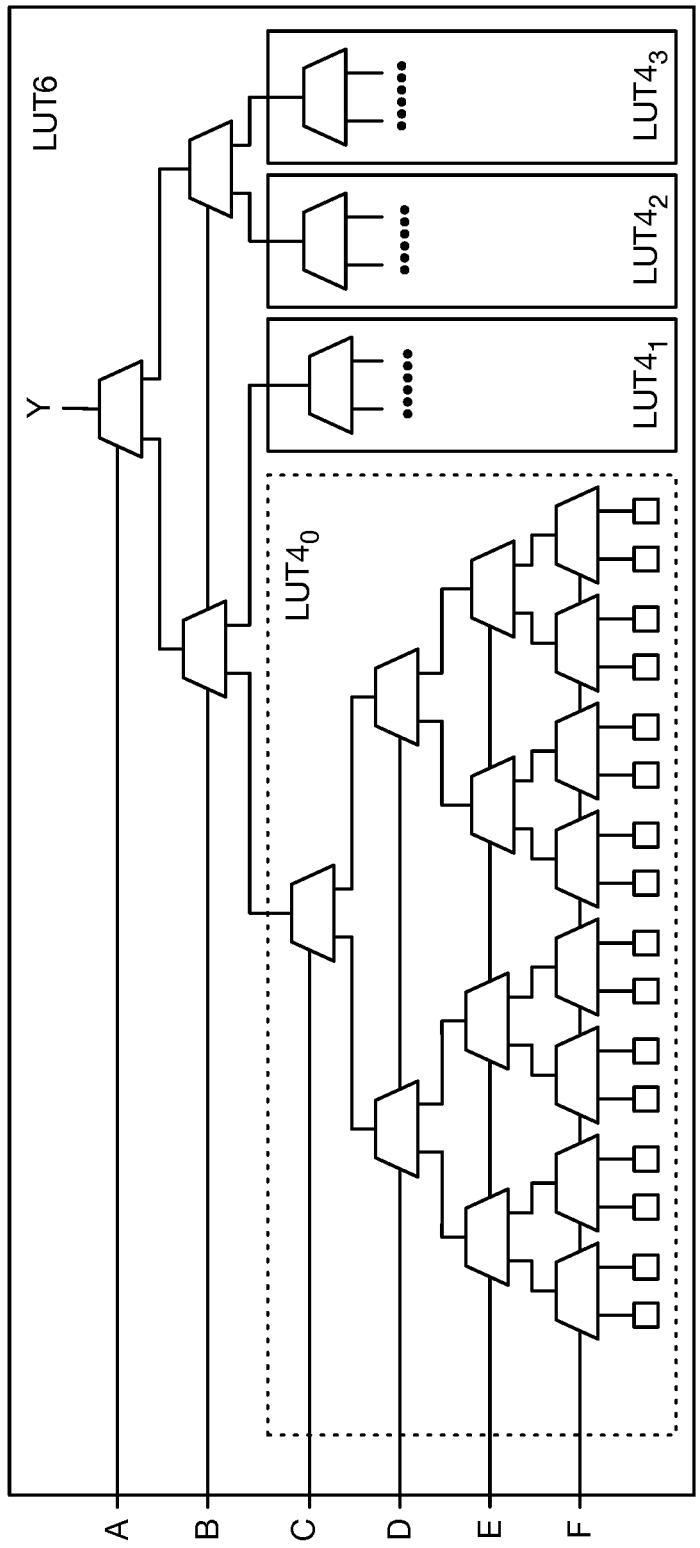
FIG. 3 is a diagram of a prior-art LUT6 module.
Figure 4:
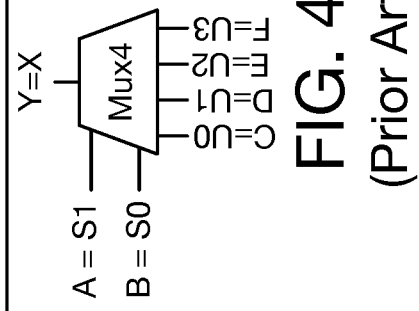
Figure 8:
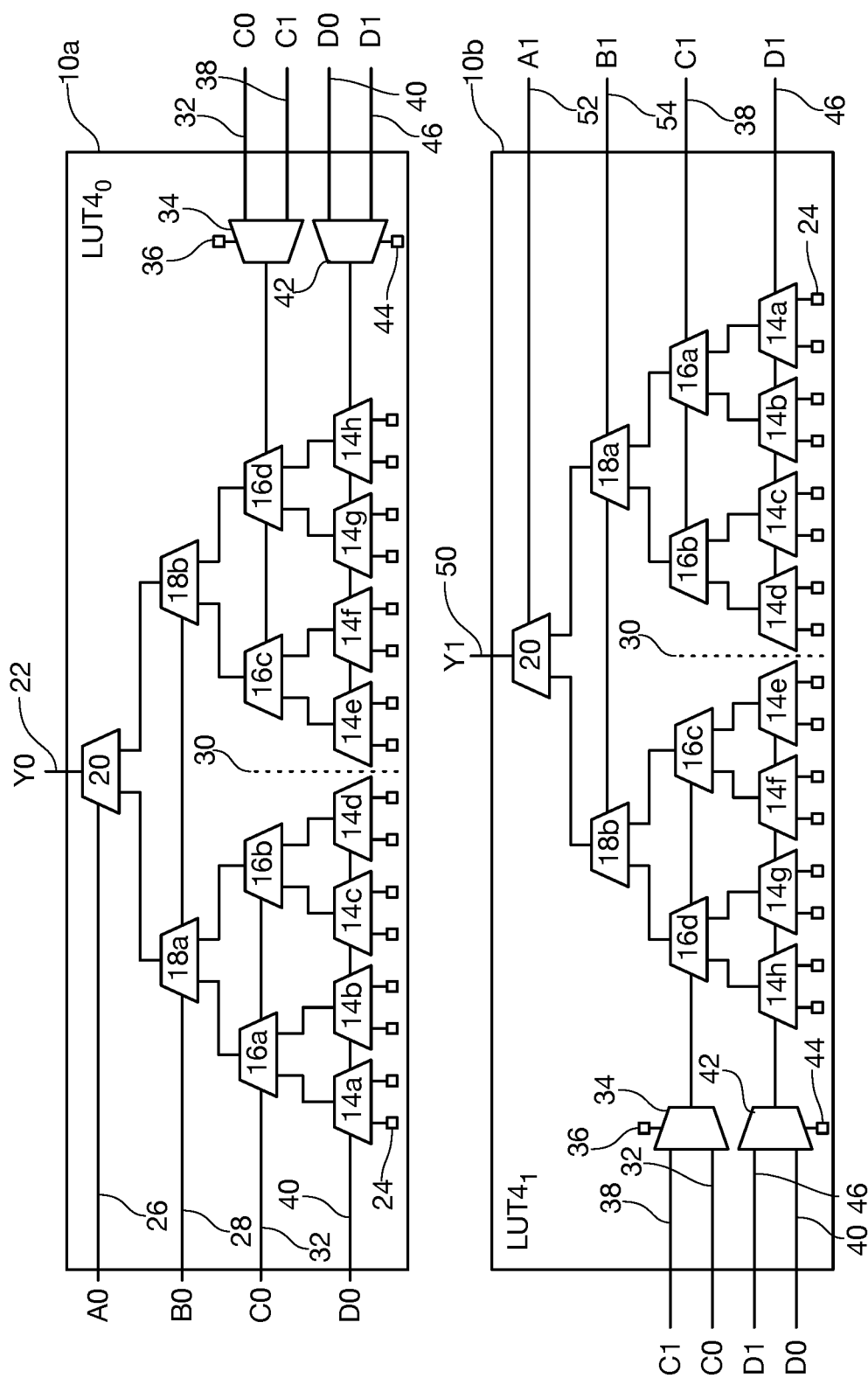
Figure 10:
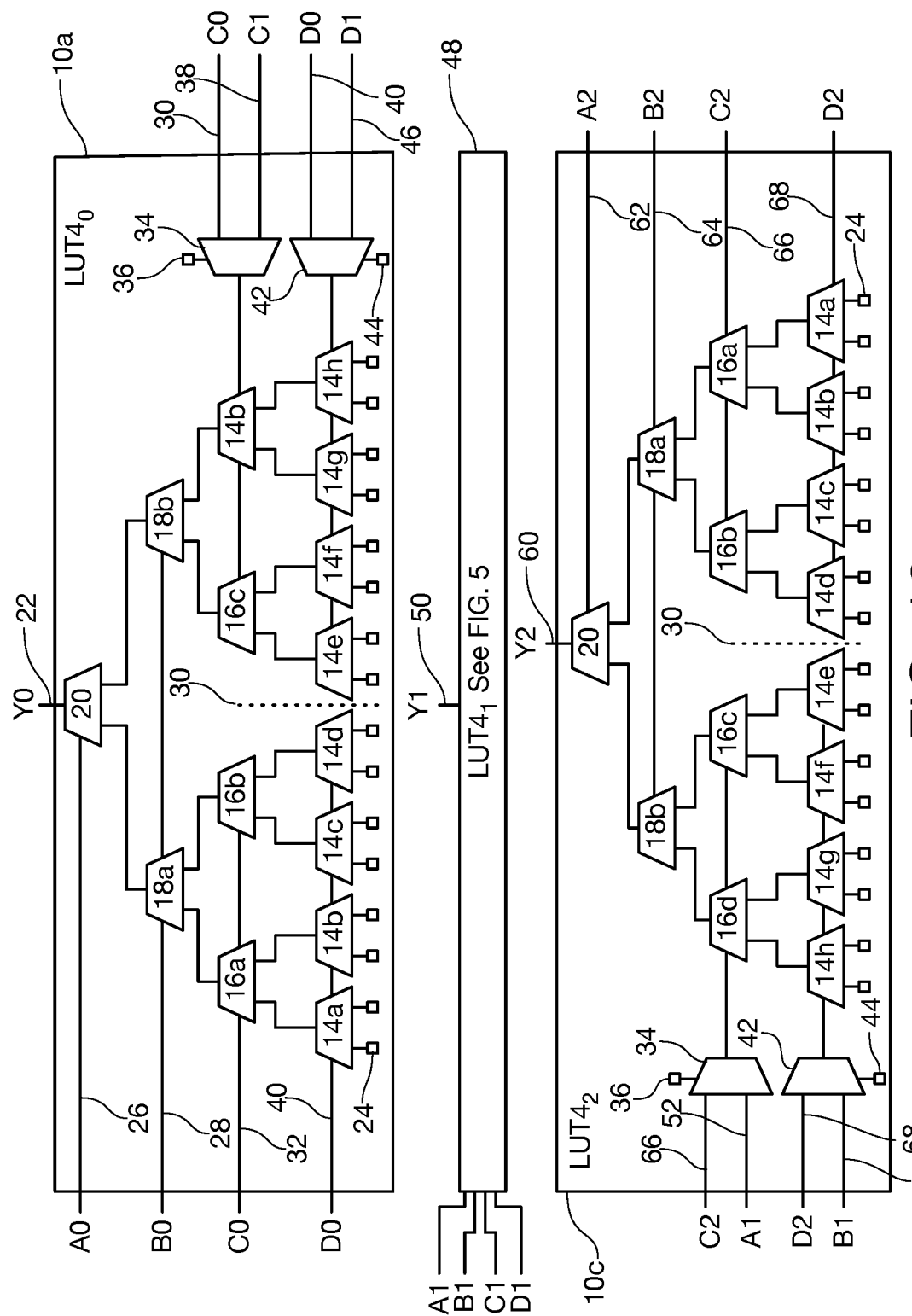
Figure 11A:
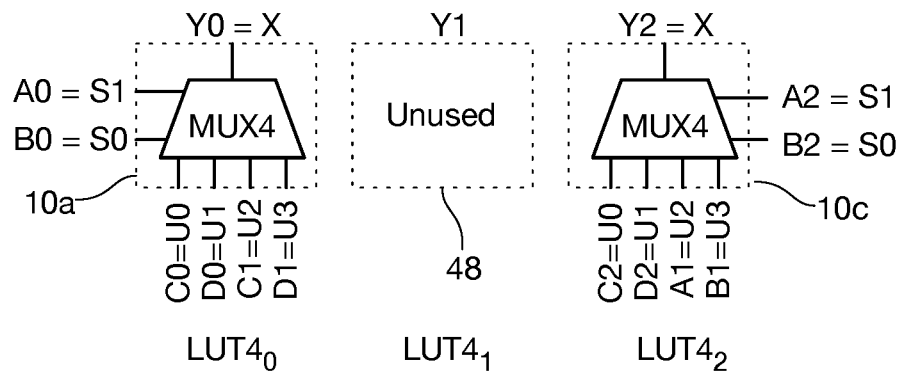
Figure 11B:
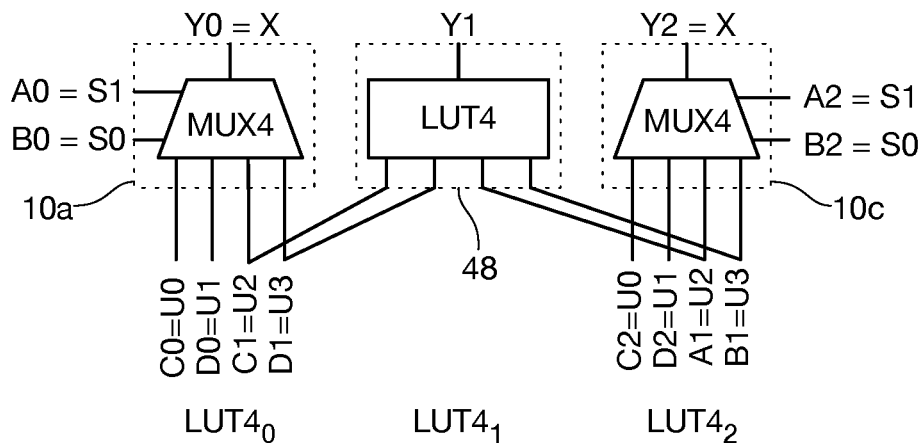
Figure 12:
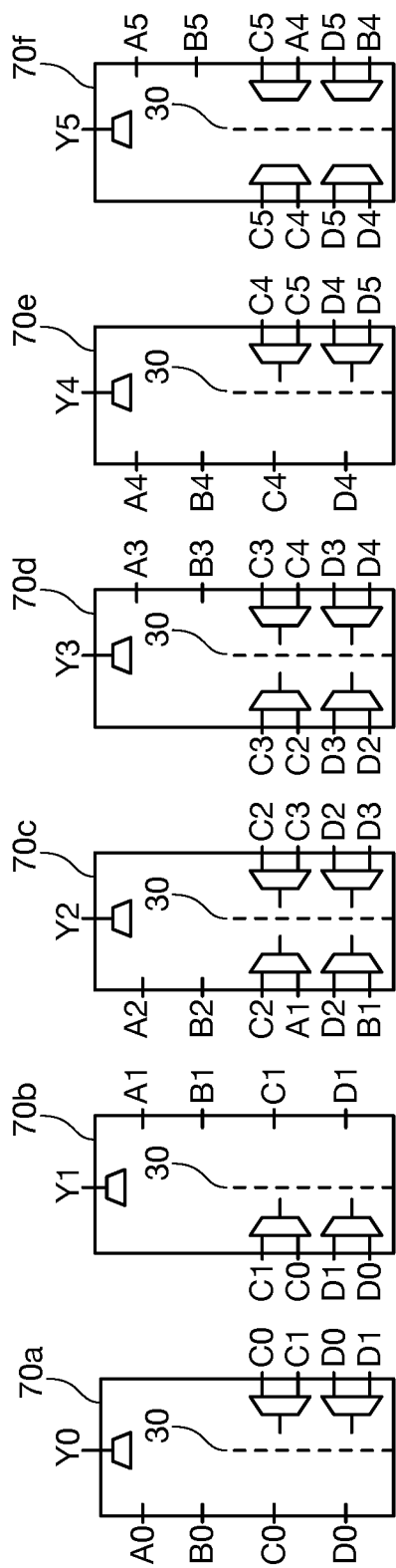

FIG. 4 a diagram showing the user-implemented 4-input multiplexer equivalent circuit of the LUT6 module of FIG. 3;

FIG. 5 is a diagram showing LUT4 modules in accordance with one aspect of the present invention;

FIG. 6 is a diagram showing the LUT4 modules of FIG. 5 configured as a 4-input multiplexer;

FIG. 7A is a diagram showing the LUT4 modules of FIG. 5 that can be used as a 4-input multiplexer circuit and a 2-input LUT;

FIG. 7B is a diagram showing the LUT4 modules of FIG. 5 that can be used as a 4-input multiplexer circuit and a 4-input LUT having two shared inputs;

FIG. 8 is a diagram showing LUT4 modules in accordance with another aspect of the present invention;

FIG. 9A is a diagram showing the LUT4 modules of FIG. 8 that can be used as a 4-input multiplexer circuit and a 2-input LUT;

FIG. 9B is a diagram showing the LUT4 modules of FIG. 8 that can be used as a 4-input multiplexer circuit and a 4-input LUT having two shared inputs;

FIG. 9C is a diagram showing the LUT4 modules of FIG. 8 that can be used as two 4-input multiplexers with four shared inputs to form a 4-input, 2-output crossbar FIG. 10 is a diagram showing LUT4 modules in accordance with another aspect of the present invention;

FIG. 11A is a diagram showing the LUT4 modules of FIG. 10 that can be used as two 4-input multiplexer circuits;

FIG. 11B is a diagram showing the LUT4 modules of FIG. 10 that can be used as two 4-input multiplexer circuits and a 4-input LUT having two shared inputs;

FIG. 12 is a diagram showing a grouping of six LUT4 modules according to another aspect of the present invention.

Figure 13A:
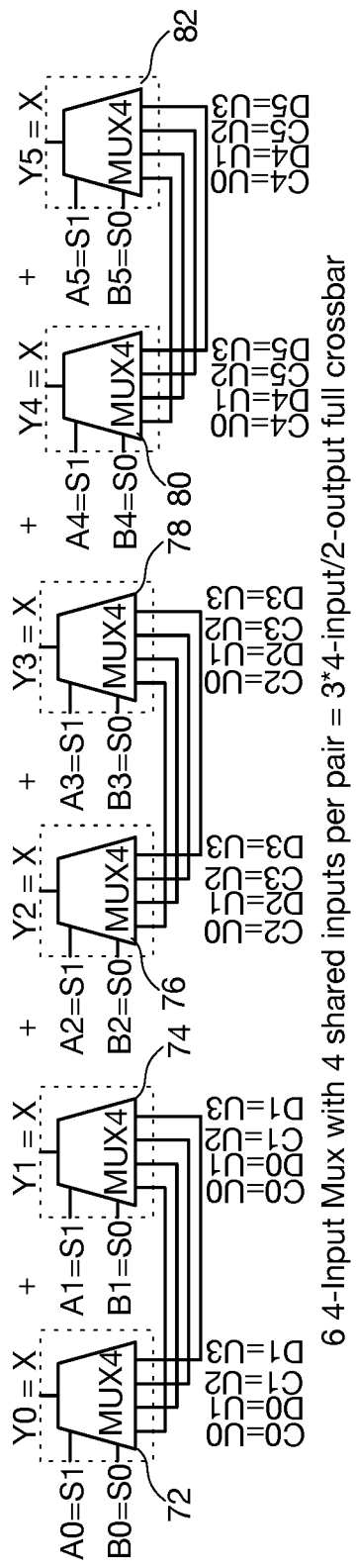
Figure 13B:
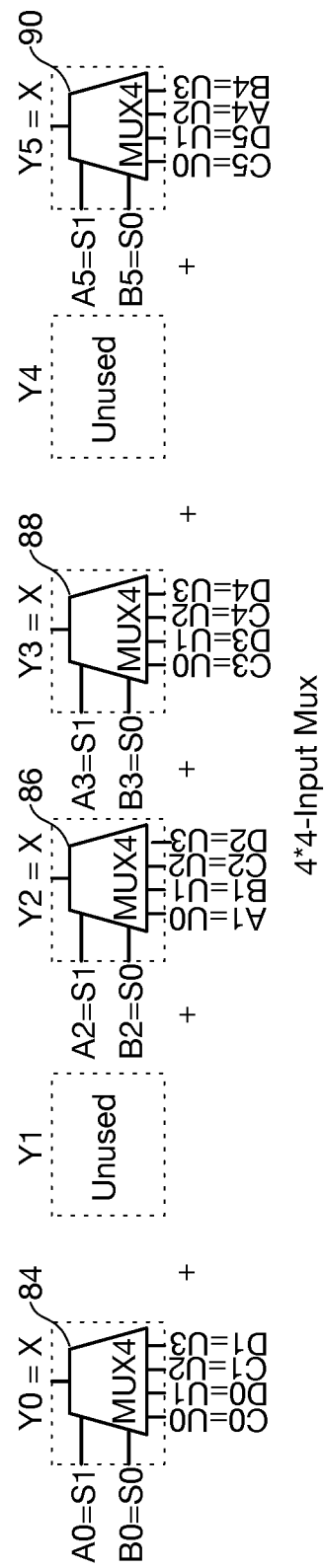
Figure 14:
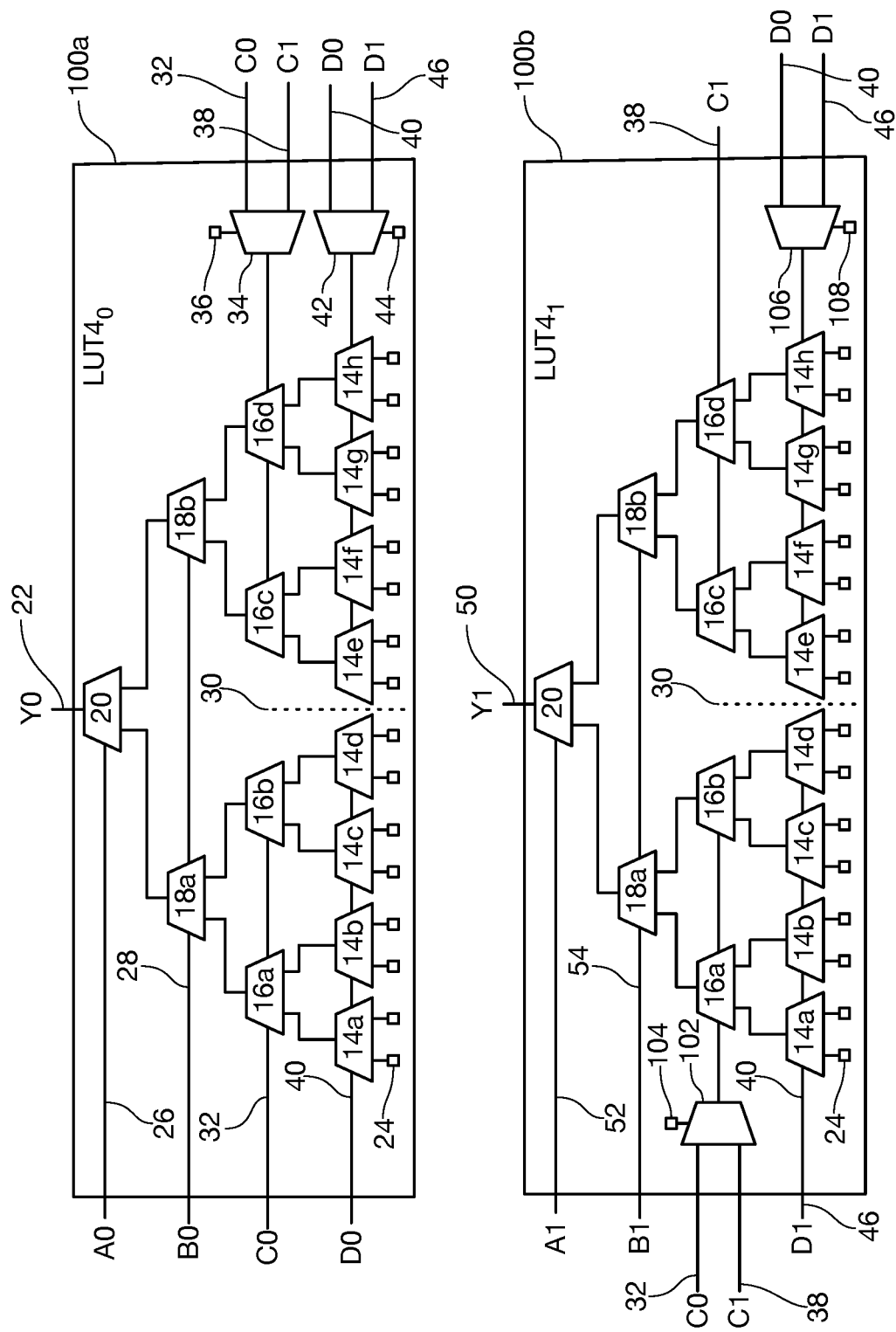

FIG. 13A is a diagram showing an arrangement of the six LUT4 modules of FIG. 12 to form six 4-input multiplexers having four shared inputs to configure three 4-input 2-output full crossbars;

FIG. 13B is a diagram showing an arrangement of the six LUT4 modules of FIG. 12 to form six independent 4-input multiplexers; and FIG. 14 is a diagram showing LUT4 modules in accordance with another aspect of the present invention.

DETAILED DESCRIPTION

Persons of ordinary skill in the art will realize that the following description of the present invention is illustrative only and not in any way limiting. Other embodiments of the invention will readily suggest themselves to such skilled persons.

Referring first of all to FIG. 5, a diagram shows two 4-input LUT4 modules. A first 4-input lookup table module (LUT4$_0$) at reference numeral 10 is configured in accordance with one aspect of the present invention and includes eight first-rank 2-input multiplexers 14a through 14h, four second-rank multiplexers 16a through 16d, two third-rank multiplexers 18a and 18b, and one fourth-rank multiplexer 20. As will be recognized by persons of ordinary skill in the art, the first-rank through fourth-rank multiplexers form a tree structure having an output Y0 identified by reference numeral 22. The data inputs of the eight first-rank 2-input multiplexers 14a through 14h are separately coupled to configuration bits as is known in the art, one of which is identified by reference numeral 24.

A select input of the fourth rank multiplexer is coupled respectively to an input signal at an input node A0 identified by reference numeral 26. Select inputs of all of the third rank multiplexers are coupled respectively to an input signal at an input node B0 identified by reference numeral 28.

Figure 1:
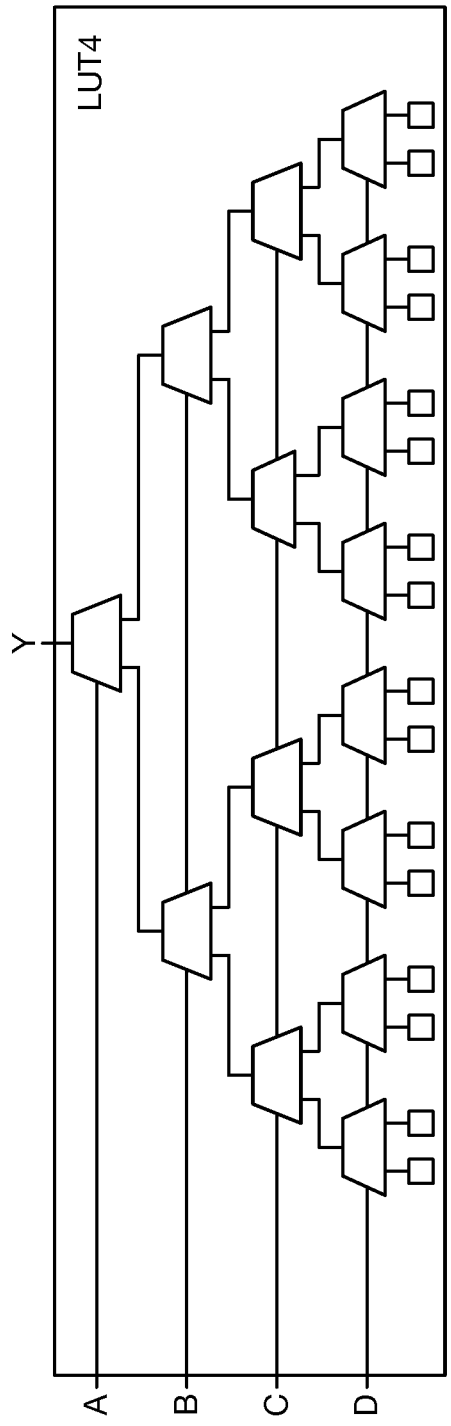
FIG. 1 is a diagram of a prior-art LUT4 module.
Figure 2:
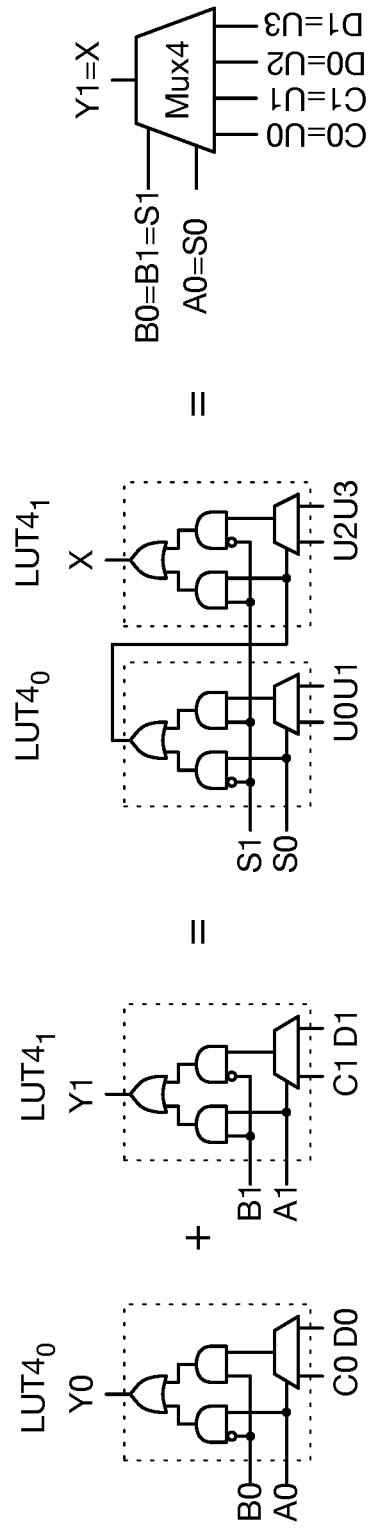
FIG. 2 is a diagram showing the user implemented 4-input multiplexer equivalent circuit of the LUT4 module of FIG. 1.

Unlike the prior-art LUT4 depicted in FIGS. 1 and 3, the select inputs of the second-rank 2-input multiplexers 16a through 16d of LUT4$_0$ at reference numeral 10 are split into two groups as illustrated by the dashed line at reference numeral 30. The select inputs of a first and a second adjacent ones 16a and 16b of the second rank 2-input multiplexers are coupled respectively to an input signal at an input node C0 identified by reference numeral 32. Select inputs of a third and fourth adjacent ones 16c and 16d of the second rank 2-input multiplexers are coupled to the output of a first select multiplexer 34. The select input of the first select multiplexer 34 is coupled to a configuration bit 36. The first select multiplexer 34 selects between the input signal at the input node C0 32 and an input signal at an input node C1 identified at reference numeral 38.

Also unlike the prior-art LUT4 depicted in FIGS. 1 and 3, the select inputs of the first-rank 2-input multiplexers 14a through 14h of LUT4$_0$ at reference numeral 10 are split into two groups. The select inputs of a first through a fourth adjacent ones 14a through 14d of the first rank 2-input multiplexers are coupled respectively to an input signal at an input node D0 identified by reference numeral 40. Select inputs of a fifth through an eighth adjacent ones 14e through 14h of the first rank 2-input multiplexers are coupled to the output of a second select multiplexer 42. The select input of the second select multiplexer 42 is coupled to a configuration bit 44. The second select multiplexer 42 selects between the input signal at the input node D0 40 and an input signal at an input node D1 identified by reference numeral 46.

The lower portion of FIG. 5 shows a LUT4$_1$ at reference numeral 48. LUT4$_1$ at reference numeral 48 is the same as the prior-art LUT4 in FIG. 1. By combining the LUT4$_0$ module 10 with the LUT4$_1$ module 48, a user may configure a 4-input multiplexer as depicted in FIG. 6. The C0 and D0 inputs of LUT4$_0$ module 10 form the data inputs U0 and U1 of the user-configured 4-input multiplexer of FIG. 6 and the C1 and D1 inputs of LUT4$_1$ module 48 form the data inputs U2 and U3 of the user-configured 4-input multiplexer. The A0 and B0 inputs of LUT4$_0$ module 10 serve as the select inputs S0 and S1 of the user-configured 4-input multiplexer of FIG. 6. The Y0 output of LUT4$_0$ module 10 serves as the output of the user-configured 4-input multiplexer of FIG. 6.

The inputs C1 and D1 to the select multiplexers 34 and 42 indicate "or any", indicating that the LUT4$_0$ module 10 can be used alone without LUT4$_1$ module 48. In such a configuration, the inputs labeled C1 and D1 to select multiplexers 34 and 42 may be sourced from any signal that can be routed to these inputs, allowing the LUT4$_0$ module to be configured as a 4-input multiplexer by itself.

Referring now to FIGS. 7A and 7B, drawings show how the LUT4$_0$ module 10 in combination with the LUT4$_1$ module 48 of FIG. 5 can be used as a 4-input multiplexer circuit and a 2-input LUT (FIG. 7A) and as a 4-input multiplexer circuit and a 4-input LUT (FIG. 7B) in applications where the 4-input multiplexer and the 4-input LUT are able to share two inputs in the user design. These combinations are not likely to be used often but are made possible because some of the inputs (A1 and B1) and the output (X1) of the LUT4$_1$ module 48 is not fully utilized in forming the 4-input multiplexer.

The 4-input multiplexer in FIG. 7A uses the A0 and B0 inputs of LUT4$_0$ module 10 as its select inputs. The 4-input multiplexer in FIG. 7A uses the C0 and D0 inputs to LUT4$_0$ module 10 as two of its data inputs, and the C1 and D1 inputs of LUT4$_1$ module 48 (or "any" signal) as the other two of its data inputs, indicating that these inputs may come from a source other than LUT4$_1$ module 48, allowing the 4-input multiplexer to be formed from LUT4$_0$ alone. In the particular case shown in FIG. 7A where the LUT4$_1$ module 48 is employed, the A1 and B1 inputs of the LUT4$_1$ module 48 can be used as inputs to a 2-input LUT having Y1 as its output.

The 4-input multiplexer in FIG. 7B also uses the A0 and B0 inputs of LUT4$_0$ module 10 as its select inputs. The 4-input multiplexer in FIG. 7B uses the C0 and D0 inputs to LUT4$_0$ module 10 as two of its data inputs, and the C1 and D1 inputs of LUT4$_1$ module 48 (or "any" signal) as the other two of its data inputs. A 4-input LUT having Y1 as its output can be formed as shown in FIG. 7B, using A1 and B1 inputs of the LUT4$_1$ module 48 as two of the inputs to a 4-input LUT. But because the C and D1 inputs come from LUT4$_1$ module 48 in the case shown in FIG. 7B, the 4-input LUT of FIG. 7B is constrained to share two of its inputs with the 4-input multiplexer. This limits its use to user designs in which this sharing can be tolerated.

Persons of ordinary skill in the art will appreciate that the inputs C and D1 provided to select multiplexers 34 and 42 of LUT4$_0$ module 10 can be generalized as inputs E0 and F0 in that they need not duplicate inputs C1 and D1 of a second LUT4$_1$ module 48 as shown in FIG. 5. Conceptualized in this manner, LUT4$_0$ module 10 may be conceptualized as a 4-input multiplexer having as its four data inputs the data inputs of the two select multiplexers 34 and 42 (inputs C0 and D0 being doubled as select inputs to the first rank and second rank multiplexers (14a-h and 16a-d) and data inputs to the select multiplexers 34 and 42) and as its select inputs the A0 and B0 inputs.

The LUT4$_0$ module 10 shown in the top portion of FIG. 5 may be advantageously employed using it as every second LUT4 in an integrated circuit layout by alternating it with the LUT4$_1$ module (reference numeral 48) as shown in the lower portion of FIG. 5. Unlike the prior-art LUT6 module of FIG. 3, the LUT4 module arrangement shown in FIG. 5 allows configuration of a 4-input multiplexer yet occupies only slightly more than two times the area of a prior-art LUT4 module rather than more than three times the area of a prior-art LUT4 module since four of them are used in the LUT6 module of FIG. 3. In addition, the LUT4 arrangement depicted in FIG. 5 employs only about half as many configuration memory cells and utilizes far less routing area than the LUT6 module of FIG. 3. Finally, the LUT4 module arrangement shown in FIG. 5 presents much less of a propagation delay than the LUT6 module of FIG. 3 for providing the same function.

Referring now to FIG. 8, a diagram shows a LUT4 module in accordance with another aspect of the present invention. The embodiment depicted in FIG. 8 is particularly advantageous when used as every LUT position in a group of LUTs in that it is very efficient for use in crossbar applications.

Two LUT4 modules LUT4$_0$ (reference numeral 10a) and LUT4$_1$ (reference numeral 10b) are shown in FIG. 8 and are mirror images of one another, a layout which may be useful with regard to physical circuit layout configurations. Because they are otherwise identical, the same reference numerals will be used to designate like elements in LUT4$_0$ module 10a and LUT4$_1$ module 10b.

Each of LUT4$_0$ module 10a and LUT4$_1$ module 10b includes eight first-rank 2-input multiplexers 14a through 14h, four second-rank multiplexers 16a through 16d, two third-rank multiplexers 18a and 18b, and one fourth-rank multiplexer 20. As will be recognized by persons of ordinary skill in the art, the first-rank through fourth-rank multiplexers form a tree structure having an output Y0 identified by reference numeral 22. The data inputs of the eight first-rank 2-input multiplexers 14a through 14h are separately coupled to configuration bits as is known in the art, one of which is identified by reference numeral 24.

A select input of the fourth rank multiplexer in LUT4$_0$ module 10a is coupled respectively to an input signal at an input node A0 identified by reference numeral 26. Select inputs of all of the third rank multiplexers in LUT4$_0$ module 10a are coupled respectively to an input signal at an input node B0 identified by reference numeral 28. A select input of the fourth rank multiplexer in LUT4$_1$ module 10b is coupled respectively to an input signal at an input node A1 identified by reference numeral 52. Select inputs of all of the third rank multiplexers are coupled respectively to an input signal at an input node B1 identified by reference numeral 54.

Like the LUT4$_0$ module 10 of FIG. 5, the select inputs of the second-rank 2-input multiplexers 16a through 16d of the LUT4$_0$ module 10a and LUT4$_1$ module 10b are split into two groups as illustrated by the dashed line at reference numeral 30. The select inputs of a first and a second adjacent ones 16a and 16b of the second rank 2-input multiplexers in LUT4$_0$ module 10a are coupled respectively to an input signal at an input node C0 identified by reference numeral 32. Select inputs of a third and fourth adjacent ones 16c and 16d of the second rank 2-input multiplexers are coupled to the output of a first select multiplexer 34. The select input of the first select multiplexer 34 is coupled to a configuration bit 36. The first select multiplexer 34 selects between the input signal at the input node C0 32 and an input signal at an input node C1 identified at reference numeral 38.

The select inputs of a first and a second adjacent ones 16a and 16b of the second rank 2-input multiplexers in LUT4$_1$ module 10b are coupled to the input signal at an input node C1 identified by reference numeral 38. Select inputs of a third and fourth adjacent ones 16c and 16d of the second rank 2-input multiplexers are coupled to the output of a first select multiplexer 34. The select input of the first select multiplexer 34 is coupled to a configuration bit 36. The first select multiplexer 34 selects between the input signal at the input node C0 32 and an input signal at an input node C1 identified at reference numeral 38.

The select inputs of the first-rank 2-input multiplexers 14a through 14h of both the LUT4$_0$ module and LUT4$_1$ module 10b of FIG. 8 are also split into two groups. The select inputs of a first through a fourth adjacent ones 14a through 14d of the first rank 2-input multiplexers in LUT4$_0$ module 10a are coupled to an input signal at an input node D0 40. The select inputs of a first through a fourth adjacent ones 14a through 14d of the first rank 2-input multiplexers in LUT4$_1$ module 10b are coupled to an input signal at an input node D1 46.

The select inputs of a fifth through an eighth adjacent ones 14e through 14h of the first rank 2-input multiplexers in LUT4$_0$ module 10a are coupled to the output of a second select multiplexer 42. The select input of the second select multiplexer 42 is coupled to a configuration bit 44. The second select multiplexer 42 selects between the input signal at the input node D0 40 and an input signal at an input node D1 identified at reference numeral 46. The select inputs of a fifth through an eighth adjacent ones 14e through 14h of the first rank 2-input multiplexers in $LUT4_1$ module 10b are coupled to the output of a second select multiplexer 42. The select input of the second select multiplexer 42 is coupled to a configuration bit 44. The second select multiplexer 42 selects between the input signal at the input node D0 40 and an input signal at an input node D1 identified at reference numeral 46.

As can be seen from an examination of FIG. 8, the shared inputs for $LUT4_0$ and $LUT4_1$ are crossed in that the $LUT4_0$ module 10a shares its inputs C0 and D0 with the $LUT4_1$ module 10b, and the $LUT4_1$ module 10b shares its inputs C1 and D1 with the $LUT4_0$ module 10a.

Referring now to FIGS. 9A, 9B, and 9C, drawings show how the combination of $LUT4_0$ and $LUT4_1$ modules of FIG. 8 can be used as a 4-input multiplexer circuit and a 2-input LUT (FIG. 9A), as a 4-input multiplexer circuit and a 4-input LUT in applications where the 4-input multiplexer and the 4-input LUT are able to share two inputs (FIG. 9B). These configurations are identical to the configurations shown in FIGS. 7A and 7B, and are explained in connection with those two drawing figures. In addition, the $LUT4_0$ and $LUT4_1$ modules of FIG. 8 can be used to form two 4-input multiplexers with four shared inputs to form a 4-input, 2-output crossbar as shown in (FIG. 9C). Thus, not only can the configurations shown in FIG. 7A and FIG. 7B be implemented, but the additional two 4-input multiplexer crossbar configuration is available.

Referring now to FIG. 10, a diagram shows LUT4 modules in accordance with another aspect of the present invention. FIG. 10 shows LUT4 modules $LUT4_0$ 10a, $LUT4_1$ module 48, and $LUT4_2$ module 10c. $LUT4_0$ module 10a and $LUT4_2$ 10c are substantially the same as the modules 10a and 10b in FIG. 8 except that $LUT4_2$ module 10c uses inputs A2 (reference numeral 62), B2 (reference numeral 64), C2 (reference numeral 66), D2 (reference numeral 68), and the inputs to the select multiplexers 34 and 42 are provided by A1 (reference numeral 52), B1 (reference numeral 54), C2 (reference numeral 66) and D2 (reference numeral 68). $LUT4_1$ module is the same as the $LUT4_1$ module depicted in FIG. 5 and is provided with inputs designated A1, B1, C1, and D1.

The outputs of $LUT4_0$ module, LUT $4_1$ module, and $LUT4_2$ module are shown as Y0, Y1, and Y2, respectively.

Whereas the $LUT4_0$ module 10a and $LUT4_1$ module 10b of FIG. 8 are used in pairs, $LUT4_0$ module and $LUT4_2$ module of FIG. 10 are used in combination with $LUT4_1$ module 48 in groups of three. This configuration is quite efficient for use in forming wider multiplexers. As will be readily appreciated by persons of ordinary skill in the art, wide multiplexers can easily be formed by employing trees of 4-input multiplexers.

Referring now to FIG. 11A, a diagram shows the LUT4 modules of FIG. 10 being used as two 4-input multiplexer circuits. The center $LUT4_1$ module 48 is unused because all of its inputs have been used as inputs to the 4-input multiplexers formed from the $LUT4_0$ module 10a and the $LUT4_2$ module 10c.

Referring now to FIG. 11B, a diagram shows the LUT4 modules of FIG. 10 being used as two 4-input multiplexer circuits and a 4-input LUT having all four inputs shared, two with the 4-input multiplexer formed from $LUT4_0$ and two with the 4-input multiplexer formed from $LUT4_2$. It is noted that the 4-input LUT having two pairs of shared inputs will not be used much given the input constraints.

Referring now to FIG. 12, a diagram shows a grouping of six LUT4 modules according to another aspect of the present invention. LUT4 modules 70a through 70f are configured in accordance with an aspect of the present invention whereby the select inputs to the first rank (multiplexers 14a through 14h) and second rank (multiplexers 16a through 16d) of multiplexers is split along dashed lines 30 as seen in FIGS. 5, 8, and 10 as well as in FIG. 12. Persons of ordinary skill in the art will recognize that, other than the designations of the inputs, LUT4 module 70a and LUT4 module 70e are the same as $LUT4_0$ module 10 in FIG. 5, and LUT4 module 70b is the same as $LUT4_1$ module 10b in FIG. 8. As persons of ordinary skill in the art will observe, in LUT4 module 70c, LUT4 module 70d, and LUT4 module 70f the select inputs of both the left and right sides of the first and second ranks of multiplexers (14a through 14h and 16a through 16d, respectively) are driven from the outputs of select multiplexers.

The LUT4 module arrangement of FIG. 12 is useful for forming full crossbars and wide multiplexers. As previously noted, wide multiplexers can easily be formed by employing trees of 4-input multiplexers. The LUT4 module arrangement of FIG. 12 is area efficient and has a low propagation delay.

Referring now to FIG. 13A, a diagram shows an arrangement of the six LUT4 modules of FIG. 12 forming six 4-input multiplexers 72, 74, 76, 78, 80, and 82 arranged in three pairs and having four shared inputs to configure three 4-input 2-output full crossbars with output pairs at Y0-Y1, Y2-Y3, and Y4-Y5.

Referring now to FIG. 13B, a diagram shows an arrangement of the six LUT4 modules of FIG. 12 to form four 4-input multiplexers 84, 86, 88, and 90 having independent inputs and having outputs at Y0, Y2, Y3, and Y5.

Referring now to FIG. 14, a diagram shows a LUT4 module in accordance with another aspect of the present invention. The embodiment depicted in FIG. 14 can implement any of the 4!=24 permutations of the data inputs between the two multiplexers. However, the ability to support some LUT input pin swapping is lost. The degree of freedom previously used to support pin swapping is used instead to implement the missing 8 multiplexer-pair input permutations.

Two LUT4 modules $LUT4_0$ (reference numeral 100a) and $LUT4_1$ (reference numeral 100b) are shown in FIG. 14. Because they share elements common to the LUT4 modules depicted in other drawing figures herein, are otherwise identical, the same reference numerals will be used to designate like elements in $LUT4_0$ module 100a and $LUT4_1$ module 100b that are common to the embodiments depicted in other drawing figures.

Each of $LUT4_0$ module 100a and $LUT4_1$ module 100b includes eight first-rank 2-input multiplexers 14a through 14h, four second-rank multiplexers 16a through 16d, two third-rank multiplexers 18a and 18b, and one fourth-rank multiplexer 20. As will be recognized by persons of ordinary skill in the art, the first-rank through fourth-rank multiplexers form a tree structure having an output Y0 identified by reference numeral 22. The data inputs of the eight first-rank 2-input multiplexers 14a through 14h are separately coupled to configuration bits as is known in the art, one of which is identified by reference numeral 24.

A select input of the fourth rank multiplexer in $LUT4_0$ module 100a is coupled respectively to an input signal at an input node A0 identified by reference numeral 26. Select inputs of all of the third rank multiplexers in $LUT4_0$ module 100a are coupled respectively to an input signal at an input node B0 identified by reference numeral 28. A select input of the fourth rank multiplexer in $LUT4_1$ module 100b is coupled respectively to an input signal at an input node A1 identified by reference numeral 52. Select inputs of all of the third rank multiplexers are coupled respectively to an input signal at an input node B1 identified by reference numeral 54.

Like the LUT4$_0$ module 10 of FIG. 5, the select inputs of the second-rank 2-input multiplexers 16a through 16d of the LUT4$_0$ module 100a and LUT4$_1$ module 100b are split into two groups as illustrated by the dashed line at reference numeral 30. The select inputs of a first and a second adjacent ones 16a and 16b of the second rank 2-input multiplexers in LUT4$_0$ module 10a are coupled respectively to an input signal at an input node C0 identified by reference numeral 32. Select inputs of a third and fourth adjacent ones 16c and 16d of the second rank 2-input multiplexers are coupled to the output of a first select multiplexer 34. The select input of the first select multiplexer 34 is coupled to a configuration bit 36. The first select multiplexer 34 selects between the input signal at the input node C0 32 and an input signal at an input node C1 identified at reference numeral 38.

The select inputs of a first and a second adjacent ones 16a and 16b of the second rank 2-input multiplexers in LUT4$_1$ module 100b are coupled to the output of a third select multiplexer 102. The select input of the third select multiplexer 102 is coupled to a configuration bit 104. The third select multiplexer 102 selects between the input signal at the input node C0 32 and an input signal at the input node C1 identified at reference numeral 38. Select inputs of a third and fourth adjacent ones 16c and 16d of the second rank 2-input multiplexers are coupled to the input signal at the input node C1 identified by reference numeral 38.

The select inputs of the first-rank 2-input multiplexers 14a through 14h of both the LUT4$_0$ module and LUT4$_1$ module 10b of FIG. 8 are also split into two groups. The select inputs of a first through a fourth adjacent ones 14a through 14d of the first rank 2-input multiplexers in LUT4$_0$ module 10a are coupled to an input signal at an input node D0 4$_0$. The select inputs of a first through a fourth adjacent ones 14a through 14d of the first rank 2-input multiplexers in LUT4$_1$ module 10b are coupled to an input signal at an input node D1 46.

Another advantage is in 4-input multiplexer performance. Using the prior art configuration shown in FIG. 1, the delay from S0, S1, A0 or A1 to Y must pass through two sequential LUTs. The slowest path through each LUT4 is D to Y. Using the prior art configuration shown in FIG. 3, the delays from A2, A3 are the longer and slower paths from E/F→Y.

With any of the embodiments shown in FIGS. 5, 8, 10, and 12, S0/S1 delays are the fast A/B→Y delays of a LUT4 module without any overhead, while the longest delay from A0/1/2/3 are the C/D→Y delays of a LUT4 module with a small overhead, but faster than the E/F→Y delays of the LUT6 module of FIG. 3.

Though pairs of multiplexers having incompatible data input ordering are rare, they do occur. This complicates the software that synthesizes a user design and maps it into LUTs.

Current synthesis algorithms have difficulty targeting multi-output functions. In view of this difficulty, the easiest way for the software to exploit the crossbar capability of the LUT4 modules of the present invention would be to select two 4:1 multiplexers sharing data inputs and pack them into a pair of LUT4 modules, without regard to data input order. The LUT4 module arrangement of FIG. 14 can support this. It can implement any 4-input 2-output crossbar.

There is a tradeoff. The LUT4 module arrangements depicted in FIGS. 8 and 12 allow some flexibility in assigning multiplexer data inputs to LUT inputs ("pin swapping"), which can be useful to the router, while the LUT4 module arrangement of FIG. 14. However it is possible that in some circumstances gaining generality with the LUT4 module arrangement of FIG. 14 would be worth sacrificing the small amount of swapping provided by the LUT4 module arrangements depicted in FIGS. 8 and 12.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A 4-input lookup table module including eight first-rank 2-input multiplexers, four second-rank 2-input multiplexers, two third-rank 2-input multiplexers, and one fourth-rank 2-input multiplexer, the first-rank through fourth-rank multiplexers forming a tree structure, wherein:
   a select input of the fourth rank 2-input multiplexer is coupled to an input signal at a first input node;
   select inputs of the third rank 2-input multiplexers are coupled to an input signal at a second input node;
   select inputs of a first and a second adjacent ones of the second rank 2-input multiplexers are electrically isolated from select inputs of a third and a fourth adjacent ones of the second rank 2-input multiplexers;
   select inputs of a first through a fourth adjacent ones of the first rank 2-input multiplexers are electrically isolated from select inputs of a fifth through an eighth adjacent ones of the first rank 2-input multiplexers;
   select inputs of a first and second adjacent ones of the second rank 2-input multiplexers are coupled to an input signal at a third input node;
   select inputs of a third and fourth adjacent ones of the second rank 2-input multiplexers are coupled to the output of a first select multiplexer;
   select inputs of a first through a fourth adjacent ones of the first rank 2-input multiplexers are coupled to an input signal at a fourth input node; and
   select inputs of a fifth through an eighth adjacent ones of the first rank 2-input multiplexers are coupled to the output of a second select multiplexer.

2. The 4-input lookup table module of claim 1 wherein:
   the first select multiplexer selects between the input signal at the third input node and an input signal at a fifth input node; and
   the second select multiplexer selects between the input signal at the fourth input node and an input signal at a sixth input node.

3. The 4-input lookup table module of claim 1 wherein data inputs of the first rank 2-input multiplexers are each separately coupled to configuration bits.

4. The 4-input lookup table module of claim 1 wherein select inputs of the first and second select multiplexers are separately coupled to configuration bits.

5. A 4-input lookup table module including eight first-rank 2-input multiplexers, four second-rank 2-input multiplexers, two third-rank 2-input multiplexers, and one fourth-rank 2-input multiplexer, the first-rank through fourth-rank multiplexers forming a tree structure, wherein:
   a select input of the fourth rank 2-input multiplexer is coupled to an input signal at a first input node;
   select inputs of the third rank 2-input multiplexers are coupled to an input signal at a second input node;
   select inputs of a first and a second adjacent ones of the second rank 2-input multiplexers are electrically isolated from select inputs of a third and a fourth adjacent ones of the second rank 2-input multiplexers;

select inputs of a first through a fourth adjacent ones of the first rank 2-input multiplexers are electrically isolated from select inputs of a fifth through an eighth adjacent ones of the first rank 2-input multiplexers;

select inputs of the first and second adjacent ones of the second rank 2-input multiplexers are coupled to the output of a first select multiplexer;

select inputs of the third and fourth adjacent ones of the second rank 2-input multiplexers are coupled to the output of a second select multiplexer;

select inputs of the first through a fourth adjacent ones of the first rank 2-input multiplexers are coupled to the output of a third select multiplexer; and select inputs of the fifth through an eighth adjacent ones of the first rank 2-input multiplexers are coupled to the output of a fourth select multiplexer.

6. The 4-input lookup table module of claim 5 wherein select inputs of the first through fourth select multiplexers are separately coupled to configuration bits.

7. The 4-input lookup table module of claim 5 wherein:

the first select multiplexer selects between the input signal at a third input node and an input signal at a fourth input node;

the second select multiplexer selects between the input signal at the third input node and an input signal at a fifth input node;

the third select multiplexer selects between the input signal at a sixth input node and an input signal at a seventh input node; and the fourth select multiplexer selects between the input signal at the sixth input node and an input signal at an eighth input node.

8. The 4-input lookup table module of claim 5 wherein data inputs of the first rank 2-input multiplexers are each separately coupled to configuration bits.

* * * * *